(12) United States Patent
Park et al.

(10) Patent No.: US 12,165,866 B2
(45) Date of Patent: Dec. 10, 2024

(54) WAFER CLEANING APPARATUS AND WAFER CLEANING METHOD USING THE SAME

(71) Applicant: SAMSUNG ELECTRONICS CO., LTD., Suwon-si (KR)

(72) Inventors: Sung Hyun Park, Daegu (KR); Seo Hyun Kim, Hwaseong-si (KR); Seung Ho Kim, Seongnam-si (KR); Young Chan Kim, Hwaseong-si (KR); Young-Hoo Kim, Yongin-si (KR); Tae-Hong Kim, Seoul (KR); Hyun Woo Nho, Yongin-si (KR); Seung Min Shin, Suwon-si (KR); Kun Tack Lee, Suwon-si (KR); Hun Jae Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 399 days.

(21) Appl. No.: 17/318,629

(22) Filed: May 12, 2021

(65) Prior Publication Data

US 2022/0084812 A1 Mar. 17, 2022

(30) Foreign Application Priority Data

Sep. 16, 2020 (KR) ........................ 10-2020-0118828

(51) Int. Cl.
*H01L 21/02* (2006.01)
*H01L 21/67* (2006.01)
(Continued)

(52) U.S. Cl.
CPC .... *H01L 21/02057* (2013.01); *H01L 21/6704* (2013.01); *G03F 7/3021* (2013.01); *G03F 7/70925* (2013.01)

(58) Field of Classification Search
CPC .......... H01L 21/02057; H01L 21/6704; H01L 21/67051; H01L 21/687; H01L 21/68735
See application file for complete search history.

(56) References Cited

U.S. PATENT DOCUMENTS

| 6,241,402 B1 | 6/2001 | Sakamoto et al. |
| 7,264,008 B2 * | 9/2007 | Kim ......................... B08B 3/02 |
| | | 134/140 |

(Continued)

FOREIGN PATENT DOCUMENTS

| JP | 3343503 B2 * | 11/2002 |
| JP | 5474840 | 4/2014 |

(Continued)

OTHER PUBLICATIONS

Machine translation of JP-3343503-B2, dated Nov. 11, 2002. (Year: 2002).*

(Continued)

*Primary Examiner* — Michael E Barr
*Assistant Examiner* — Kevin G Lee
(74) *Attorney, Agent, or Firm* — F. Chau & Associates, LLC

(57) ABSTRACT

A wafer cleaning method is provided. The wafer cleaning method includes providing a wafer on a stage that is inside of a chamber. The wafer is fixed to the stage by moving a grip pin connected to an edge of the stage. First ultrapure water is supplied onto the wafer while the wafer is rotating at a first rotation speed. The grip pin is released from the wafer by moving the grip pin. A development process is performed by supplying liquid chemical onto the wafer while the wafer is rotating at a second rotation speed that is less than the first rotation speed.

20 Claims, 14 Drawing Sheets

(51) Int. Cl.
*G03F 7/00* (2006.01)
*G03F 7/30* (2006.01)

(56) References Cited

U.S. PATENT DOCUMENTS

| | | | |
|---|---|---|---|
| 7,290,948 B2 | 11/2007 | Ito | |
| 7,998,308 B2 | 8/2011 | Kaneko et al. | |
| 8,714,169 B2* | 5/2014 | Lee | H01L 21/67051 |
| | | | 134/149 |
| 10,741,423 B2* | 8/2020 | Nakano | H01L 21/67034 |
| 2007/0220775 A1 | 9/2007 | Miya | |
| 2008/0011325 A1* | 1/2008 | Olgado | H01L 21/67046 |
| | | | 15/21.1 |
| 2014/0053869 A1* | 2/2014 | Chen | H01L 21/67028 |
| | | | 134/33 |
| 2017/0287769 A1* | 10/2017 | Ota | H01L 21/67109 |
| 2019/0164786 A1* | 5/2019 | Chen | H01L 21/68728 |
| 2020/0035514 A1 | 1/2020 | Yoshihara et al. | |
| 2020/0321237 A1* | 10/2020 | Miyazaki | H01L 21/68728 |

FOREIGN PATENT DOCUMENTS

| | | | |
|---|---|---|---|
| JP | 2021176178 A * | 11/2021 | H01L 21/68721 |
| KR | 1998-016851 | 6/1998 | |
| KR | 10-1597211 | 2/2016 | |
| KR | 20160116638 | 10/2016 | |
| KR | 10-2017-0113114 | 10/2017 | |

OTHER PUBLICATIONS

Machine translation of JP-2021176178-A, dated Nov. 4, 2021. (Year: 2021).*
1st Office Action dated Mar. 27, 2024 in corresponding KR Appln. No. 10-2020-0118828.

* cited by examiner

FIG. 2
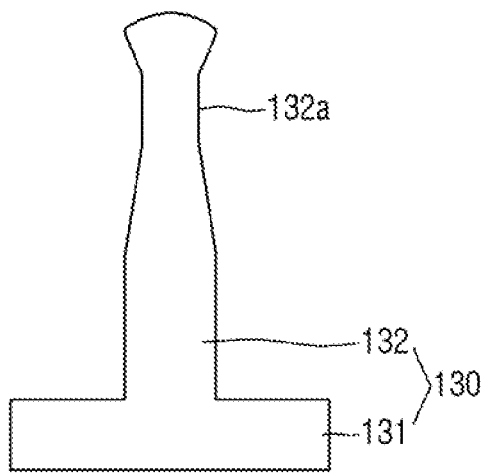
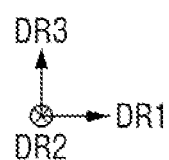
FIG. 3
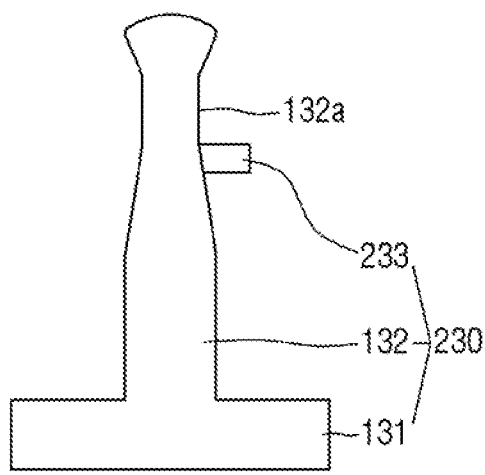
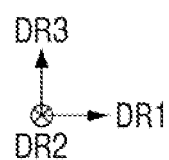

FIG. 14
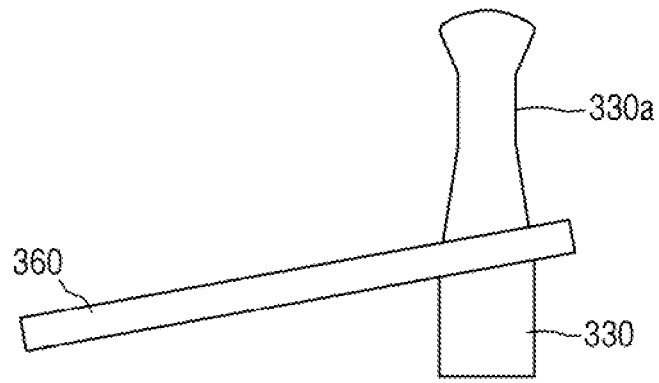
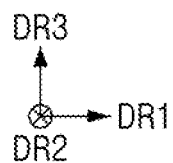
FIG. 15
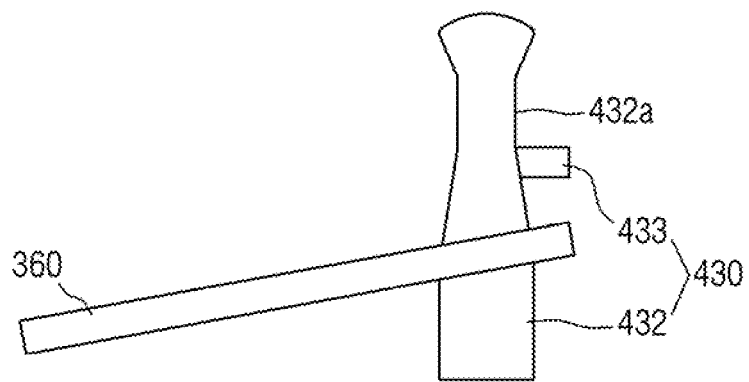
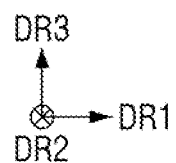

WAFER CLEANING APPARATUS AND WAFER CLEANING METHOD USING THE SAME

CROSS-REFERENCE TO RELATED APPLICATION

This application claims priority under 35 U.S.C. § 119 to Korean Patent Application No. 10-2020-0118828 filed on Sep. 16, 2020 in the Korean Intellectual Property Office, the contents of which is herein incorporated by reference.

TECHNICAL FIELD

The present disclosure relates to semiconductor wafers and, more particularly, to a semiconductor wafer cleaning apparatus and a method for cleaning semiconductor wafers using the same.

DISCUSSION OF THE RELATED ART

Semiconductor devices play an important role in modern life. Processes for manufacturing semiconductor devices generally include a step of forming a layer on a substrate and patterning the layer so as to have desired electrical characteristics.

The patterning may be performed by sequentially or repeatedly performing unit processes such as chemical vapor deposition, sputtering, photolithography, etching, ion implantation, chemical mechanical polishing (CMP), and the like. These steps may be performed within a processing chamber. In performing a photolithography process, a photoresist pattern is formed on a wafer by a development process that uses a liquid chemical. The development process may cause problems such as deterioration of a wafer, damage to a stage, and the like at a portion where the liquid chemical is in contact with the stage.

SUMMARY

A wafer cleaning method includes providing a wafer on a stage inside of a chamber. The wafer is fixed to the stage by moving a grip pin connected to an edge of the stage. First ultrapure water is provided onto the wafer while it is rotating at a first rotation speed. The grip pin is released from the wafer by moving the grip pin. A development process is performed by supplying liquid chemical onto the wafer while the wafer is rotating at a second rotation speed that is less than the first rotation speed.

Ac wafer cleaning apparatus includes a chamber. A stage is disposed inside of the chamber. The stage includes a connection groove formed at an edge thereof, a nozzle configured to supply liquid chemical to a wafer provided on the stage, and a grip pin, at least a part of which is disposed inside of the connection groove and which is moved toward a center of the stage to fix the wafer.

A wafer cleaning apparatus includes a chamber. A stage is disposed inside of the chamber. A nozzle is configured to supply liquid chemical to a wafer provided on the stage. A grip pin is disposed on a top surface of an edge of the stage to fix the wafer in place. A first liquid chemical guide portion is connected to the grip pin and is inclined with respect to a top surface of the stage. The first liquid chemical guide portion projects laterally from the edge of the stage.

BRIEF DESCRIPTION OF THE DRAWINGS

The above and other aspects and features of the present disclosure will become more apparent by describing in detail embodiments thereof with reference to the attached drawings, in which:

FIG. 2 is a cross-sectional view illustrating a grip pin of a wafer cleaning apparatus according to some embodiments of the present disclosure;

FIG. 3 is a cross-sectional view illustrating a grip pin of a wafer cleaning apparatus according to some embodiments of the present disclosure;

FIG. 14 is a cross-sectional view illustrating a grip pin of a wafer cleaning apparatus according to some embodiments of the present disclosure;

FIG. 15 is a cross-sectional view illustrating a grip pin of a wafer cleaning apparatus according to some embodiments of the present disclosure;

DETAILED DESCRIPTION OF THE EMBODIMENTS

Hereinafter, a wafer cleaning apparatus according to some embodiments of the present disclosure will be described with reference to FIGS. 1 to 5.

Figure 1:
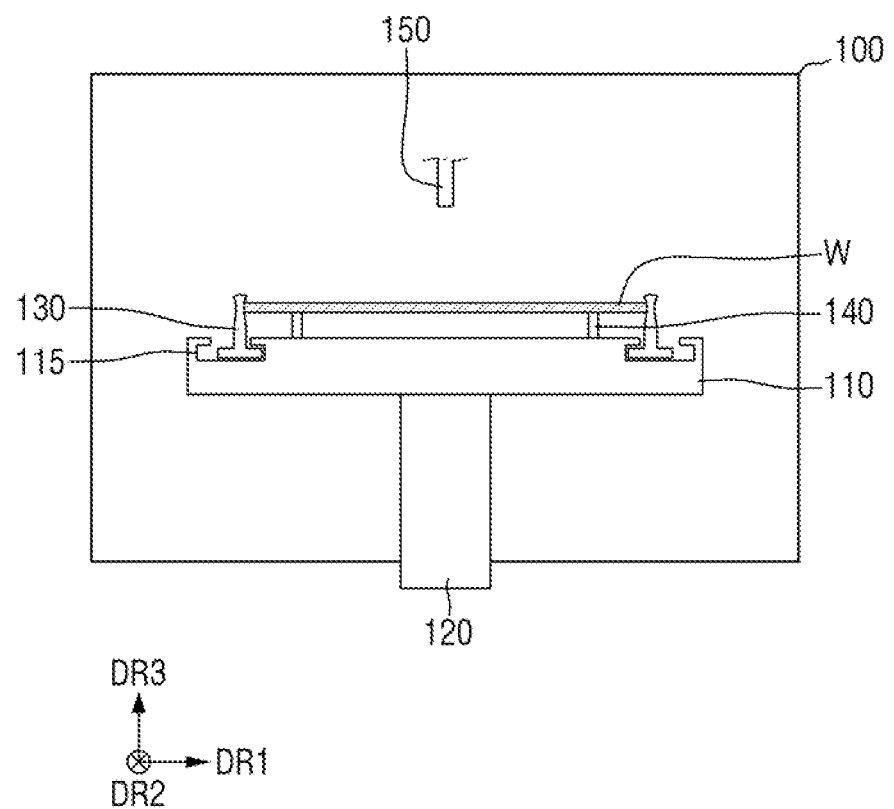
FIG. 1 is a cross-sectional view illustrating a wafer cleaning apparatus according to some embodiments of the present disclosure.
Figure 4:
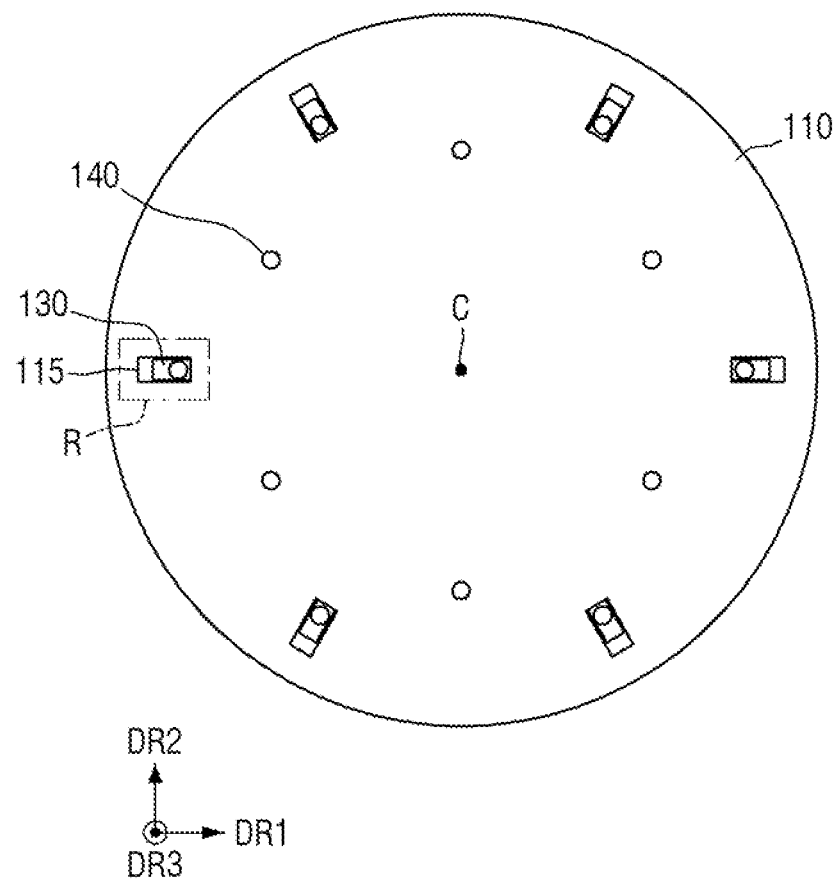
FIG. 4 is a plan view illustrating a stage of a wafer cleaning apparatus according to some embodiments of the present disclosure.
Figure 5:
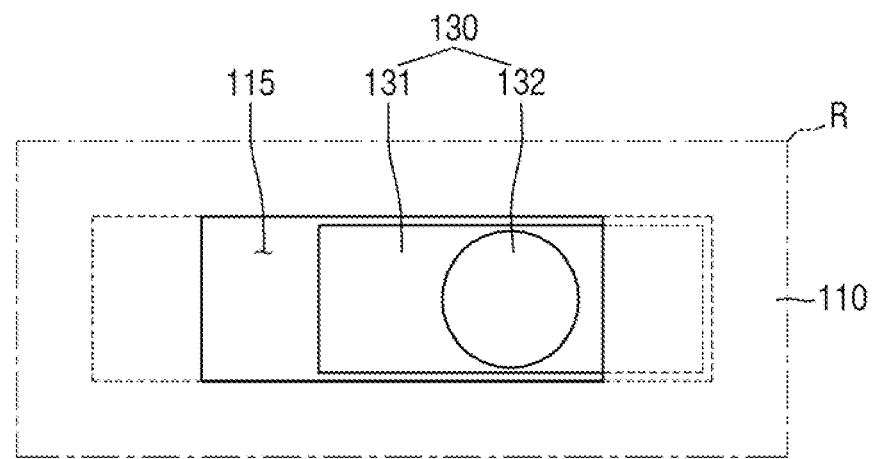
FIG. 5 is an enlarged view of area R of FIG. 4.

FIG. 1 is a cross-sectional view illustrating a wafer cleaning apparatus according to some embodiments of the present disclosure. FIG. 2 is a cross-sectional view illustrating a grip pin of a wafer cleaning apparatus according to some embodiments of the present disclosure. FIG. 3 is a cross-sectional view illustrating a grip pin of a wafer cleaning apparatus according to embodiments of the present disclosure. FIG. 4 is a plan view illustrating a stage of a wafer cleaning apparatus according to some embodiments of the present disclosure. FIG. 5 is an enlarged view of area R of FIG. 4.

A first direction DR1 may be a first horizontal direction. A second direction DR2 may be a second horizontal directions different from the first direction DR1. The second direction DR2 may intersect the first direction DR1. For example, the second direction DR2 may be perpendicular to the first direction DR1. A third direction DR3 may intersect the first direction DR1 and the second direction DR2. The third direction DR3 may be perpendicular to, e.g., both the first direction DR1 and the second direction DR2. The third direction DR3 may be, e.g., a vertical direction. Accordingly, the first direction DR1, the second direction DR2, and the third direction DR3 may be orthogonal to each other.

Referring to FIGS. 1 to 5, the wafer cleaning apparatus, according to some embodiments of the present disclosure, includes a chamber 100, a stage 110, a support 120, a grip pin 130, a support pin 140, and a nozzle 150.

A wet etching process and a cleaning process may be performed within the chamber 100. For example, a development process of a photolithography process may be performed within the chamber 100. The wafer W may be loaded into the chamber 100. An exposed photoresist, for example, may be formed on the wafer W.

The stage 110 may be disposed in the chamber 100. The wafer W loaded into the chamber 100 may be disposed on the stage 110. The support 120 may be connected to the bottom portion of the stage 110. The support 120 may rotate about an axis of rotation extending in the third direction DR3. The support 120 may rotate the stage 110 on the plane defined in the first direction DR1 and the second direction DR2. The support 120 may be moved, e.g., in the third direction DR3. Accordingly, the stage 110 may be moved in the third direction DR3 by the support 120.

A connection groove 115 may be formed on the top surface of the stage 110. The connection groove 115 may be disposed within the top surface of the stage 110. The connection groove 115 may extend from the edge of the stage 110 toward a center C (as may be seen in FIG. 4) of the stage 110.

A plurality of connection grooves 115 may be formed at the edge of the stage 110. Each of the plurality of connection grooves may be spaced apart from each other. Although FIG. 4 illustrates that six connection grooves 115 are formed at the edge of the stage 110, this is only an example and the present disclosure is not necessarily limited thereto. In some embodiments, three or more connection grooves 115 may be formed at the edge of the stage 110.

The width of the portion of the connection groove 115 formed in the stage 110 may be greater than the width of the portion of the connection groove 115 exposed to the top surface of the stage 110. For example, as shown in FIG. 1, the width of the portion of the connection groove 115 formed in the stage 110 in the first direction DR1 may be greater than the width of the portion of the connection groove 115 exposed to the top surface of the stage 110 in the first direction DR1.

At least a part of the upper portion of the stage 110 may project laterally toward the connection groove 115. For example, at least a part of the upper portion of the stage 110 may overlap the connection groove 115 in the third direction DR3. In this way, the connection groove 115 may be at least partially covered by a part of the upper portion of the stage 110.

The grip pin 130 may be disposed at the edge on the top surface of the stage 110. At least a part of the grip pin 130 may be disposed in the connection groove 115. The grip pin 130 may at least partially overlap the connection groove 115 in the third direction DR3. For example, the grip pin 130 may contact the stage within the connection groove 115.

For example, as shown in FIG. 4, six grip pins 130 may be disposed at the edge on the top surface of the stage 110. However, this is only an example, and the present disclosure is not necessarily limited thereto. The number of the grip pins 130 may correspond to the number of the connection grooves 115.

In some embodiments, as shown in FIG. 2, the grip pin 130 may have a first portion 131 and a second portion 132. The first portion 131 of the grip pin 130 may be disposed within the connection groove 115. The first portion 131 of the grip pin 130 may extend from the edge of the stage 110 toward the center C of the stage 110.

The second portion 132 of the grip pin 130 may project from the first portion 131 of the grip pin 130 in the third direction DR3. For example, the second portion 132 of the grip pin 130 may project from the top surface of the stage 110 in the third direction DR3.

The second portion 132 of the grip pin 130 may be in contact with the side surface of the wafer W. The second portion 132 of the grip pin 130 may have a wafer contact portion 132a that is in contact with the side surface of the wafer W. The width of the wafer contact portion 132a in the first direction DR1 may be smaller than the width of other adjacent parts of the second portion 132 of the grip pin 130 in the first direction DR1. Accordingly, the wafer W may be stably fixed to the wafer contact portion 132a of the second portion 132 of the grip pin 130.

The grip pin 130 may be moved from the edge of the stage 110 toward the center C of the stage 110 along the connection groove 115. Further, the grip pin 130 may be moved from the center C of the stage 110 toward the edge of the stage 110 along the connection groove 115. The movement of the grip pin 130 is related to a wafer cleaning method according to some embodiments of the present disclosure, and detailed description thereof is provided below.

The grip pin 130 may contain, e.g., silicon carbide (SiC), but the present disclosure is not necessarily limited thereto. In some embodiments, the grip pin 130 may contain a material having a hydrophobic property.

In some embodiments, as shown in FIG. 3, the grip pin 230 may have a first portion 131, a second portion 132, and a third portion 233. The third portion 233 of the grip pin 230 may be disposed on the sidewall of the second portion 132 of the grip pin 230. The third portion 233 of the grip pin 230 of the grip pin 230 may project from the second portion 132 of the grip pin 230 toward the center C of the stage 110. The third portion 233 of the grip pin 230 may be in contact with the bottom surface of the wafer W.

In the wafer cleaning apparatus according to some embodiments of the present disclosure shown in FIG. 3, the wafer W may be effectively fixed by forming the third portion 233 of the grip pin 230 projecting from the second portion 132 of the grip pin 230 on the sidewall of the grip pin 230 that is in contact with the wafer W.

The support pins 140 may be disposed on the top surface of the stage 110. The support pins 140 may be disposed between the edge of the stage 110 where the grip pins 130 are disposed and the center C of the stage 110 on the top surface of the stage 110. Although FIG. 4 illustrates that six support pins 140 are arranged, this is only an example and the present disclosure is not necessarily limited thereto. In some embodiments, three or more support pins 140 may be arranged on the top surface of the stage 110.

The support pins 140 may be in contact with the bottom surface of the wafer W. For example, the wafer W disposed on the stage 110 may be supported by the support pins 140. The height of the support pin 140 in the third direction DR3 may be smaller than the height of the grip pin 130 in the third direction DR3. The support pin 140 may contain, e.g., silicon carbide (SiC), but the present disclosure is not necessarily limited thereto.

In some embodiments, an additional component containing a material having an excellent adhesive property may be disposed between the support pins 140 and the bottom surface of the wafer W. In this case, the additional component having an excellent adhesive property may effectively rotate the wafer W in a state where the grip pins 130 are released from the side surface of the wafer W.

The nozzle 150 may be disposed on the stage 110. The nozzle 150 may supply liquid chemical to the wafer W disposed on the stage 110. For example, the nozzle 150 may supply the liquid chemical to the center of the wafer W. The liquid chemical may spread over the entire top surface of the wafer W as the wafer W rotates. A central axis of the nozzle 150 may be aligned with the axis of rotation of the support 120.

The nozzle 150 may be disposed on the top surface of the wafer W. Although it is not illustrated in FIG. 1, the nozzle 150 may be disposed on the bottom surface of the wafer W. The nozzle 150 may supply the liquid chemical to both the top surface and the bottom surface of the wafer W.

Although FIG. 1 illustrates that the nozzle 150 is disposed on the top surface of the wafer W, the present disclosure is not necessarily limited thereto. In some embodiments, the nozzle 150 may be disposed on the side surface of the wafer W at a position higher than the top surface of the wafer W. Further, in some embodiments, the nozzle 150 may inject the liquid chemical laterally to supply the liquid chemical to the top surface of the wafer W.

The exposed photoresist formed on the wafer W may be etched by the liquid chemical. A photoresist pattern may be formed by such a development process. When the exposed photoresist is a positive photoresist, an exposed portion may be etched by the liquid chemical to form the photoresist pattern. When the exposed photoresist is a negative photoresist, an unexposed portion may be etched by the liquid chemical to form the photoresist pattern.

Hereinafter, a wafer cleaning method using a wafer cleaning apparatus according to some embodiments of the present disclosure will be described with reference to FIGS. 6 to 12.

Figure 6:
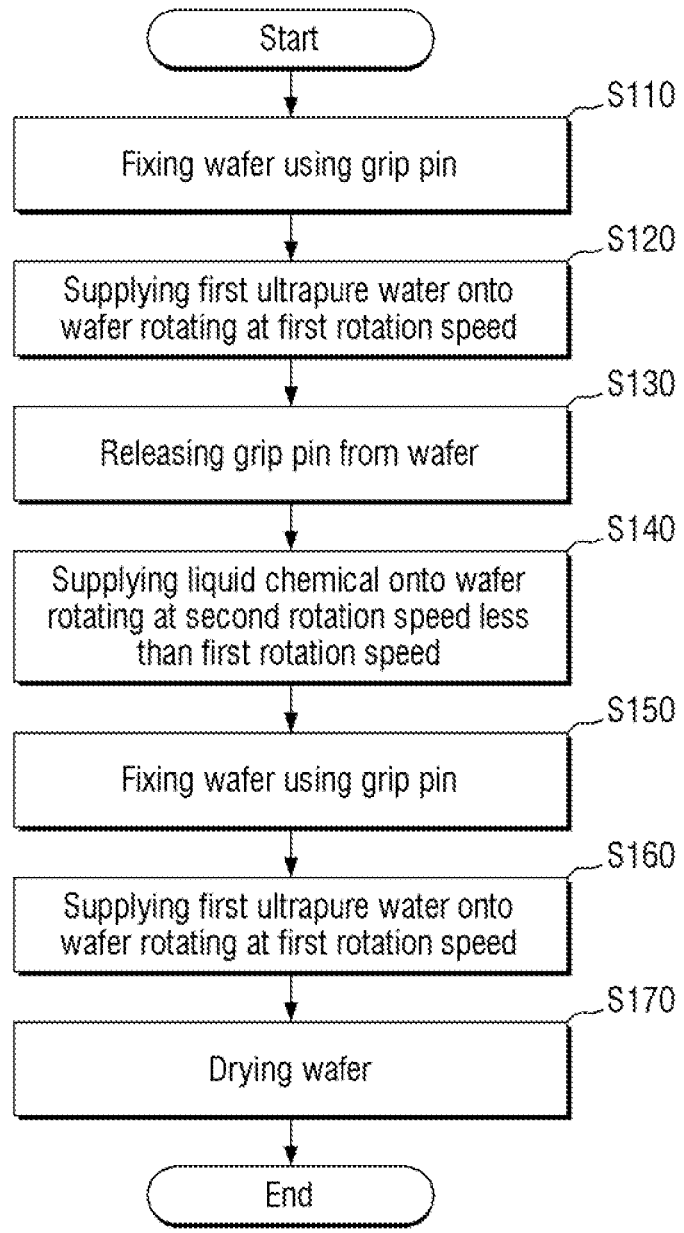
FIG. 6 is a flowchart illustrating a wafer cleaning method using the wafer cleaning apparatus shown in FIG. 1.

FIG. 6 is a flowchart illustrating a wafer cleaning method using the wafer cleaning apparatus shown in FIG. 1. FIGS. 7 to 12 are diagrams illustrating a wafer cleaning method using the wafer cleaning apparatus shown in FIG. 1.

Referring to FIG. 6, the wafer W having the exposed photoresist may be disposed on the stage 110 within the chamber 100. The exposed photoresist may be formed by forming a photoresist on the wafer W, forming a mask pattern on the photoresist, and exposing the photoresist using the mask pattern.

The wafer W disposed on the stage 110 may be fixed to the stage 110 by the grip pins 130 (step S110). The grip pins 130 may be moved toward the center C of the stage 110 along the connection groove 115 and brought into contact with the side surface of the wafer W to fix the wafer W to the stage 110. The bottom surface of the wafer W may be supported by the support pins 140.

Figure 7:
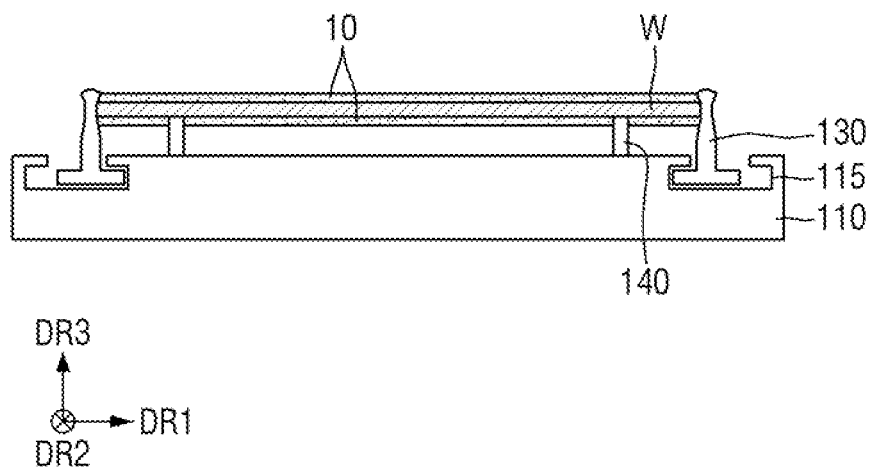
FIGS. 7 to 12 are cross-sectional diagrams illustrating a wafer cleaning method using the wafer cleaning apparatus shown in FIG. 1.

Referring to FIGS. 6 and 7, the stage 110 may rotate about the center C of the stage 110 on the plane defined in the first direction DR1 and the second direction DR2. The wafer W fixed to the stage 110 by the grip pins 130 and the support pins 140 may be rotated by the rotation of the stage 110. In this case, each of the stage 110 and the wafer W may rotate at a first rotation speed. The first rotation speed may be, e.g., 100 rpm or more. The stage 110 may be made to rotate by rotation of the support 120.

First ultrapure water 10 may be supplied on the wafer W while the Wafer W is rotating at the first rotation speed (step S120). The first ultrapure water 10 may be supplied on both the top surface and the bottom surface of the wafer W. The first ultrapure water 10 may remove impurities on the wafer W and may assist coating of hydrophilic liquid chemical in a subsequent step.

Figure 8:
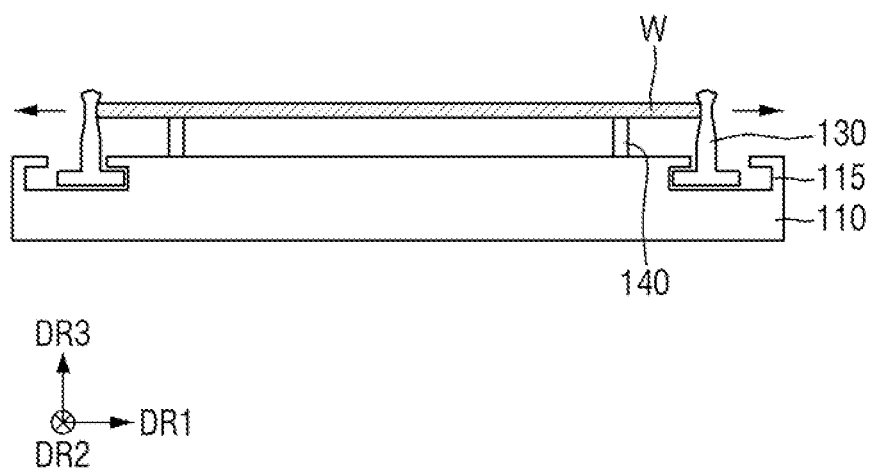

Referring to FIGS. 6 and 8, the first ultrapure water 10 supplied on the wafer W may be removed. A part of the first ultrapure water 10 may remain on the wafer W. However, the present disclosure is not necessarily limited thereto.

Next, the grip pins 130 may be moved and released from the wafer W (step S130). The grip pins 130 may be moved along the connection groove 115 toward the edge of the stage 110 and separated from the side surface of the wafer W. The rotation of the wafer W may be stopped during the release of the grip pins 130 from the wafer W. However, the present disclosure is not necessarily limited thereto.

Figure 9:
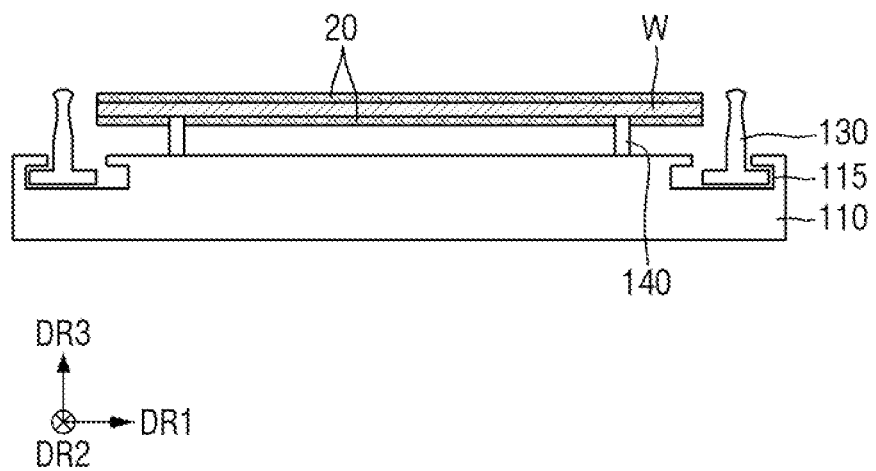
Figure 10:
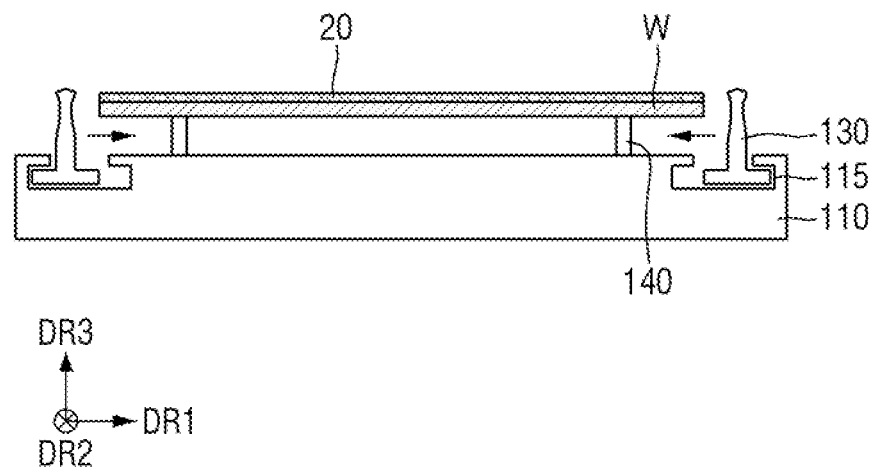

Referring to FIGS. 6, 9 and 10, the stage 110 may rotate about the center C of the stage 110 on the plane defined in the first direction DR1 and the second direction DR2. The wafer W fixed to the stage 110 by the support pins 140 may be rotated as the stage 110 rotates. In this case, each of the stage 110 and the wafer W may rotate at a second rotation speed. The second rotation speed may be lower than the first rotation speed. The second rotation speed may be less than, e.g., 100 rpm.

Liquid chemical 20 may be supplied on the wafer W rotating at the second rotation speed (step S140). The liquid chemical 20 may be supplied on both the top surface and the bottom surface of the wafer W. In this case, the liquid chemical 20 supplied on the bottom surface of the wafer W may be removed by rotating the wafer W at the second rotation speed that is a relatively low rotation speed. However, the present disclosure is not necessarily limited thereto.

Next, a development process of etching the exposed photoresist formed on the wafer W using the liquid chemical may be performed. When the exposed photoresist is a positive photoresist, an exposed portion may be etched by the liquid chemical 20 to form a photoresist pattern. When the exposed photoresist is a negative photoresist, an unexposed portion may be etched by the liquid chemical 20 to form a photoresist pattern.

Figure 11:
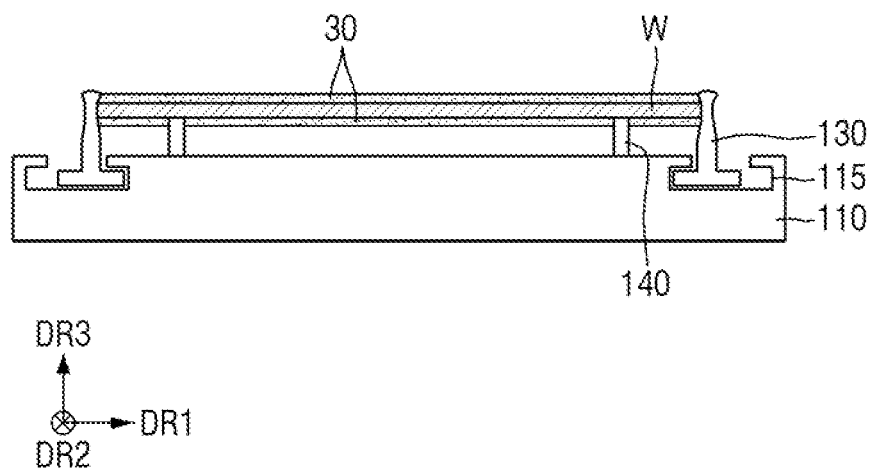

Referring to FIGS. 6 and 11, after the development is completed, the wafer W disposed on the stage 110 may be fixed by the grip pins 130 (step S150). The grip pins 130 may be moved toward the center C of the stage 110 along the connection groove 115 and brought into contact with the side surface of the wafer W to fix the wafer W.

Next, the stage 110 may rotate about the center C of the stage 110 on the plane defined by the first direction DR1 and the second direction DR2. The wafer W fixed to the stage 110 by the grip pins 130 and the support pins 140 may be rotated as the stage 110 rotates. In this case, each of the stage 110 and the wafer W may rotate at the first rotation speed.

Second ultrapure water 30 may be supplied on the wafer W rotating at the first rotation speed (step S160). The second ultrapure water 30 may be supplied on both the top surface and the bottom surface of the wafer W. A cleaning process may be performed using the second ultrapure water 30 to remove the liquid chemical 20 and by-products remaining on the wafer W.

Figure 12:
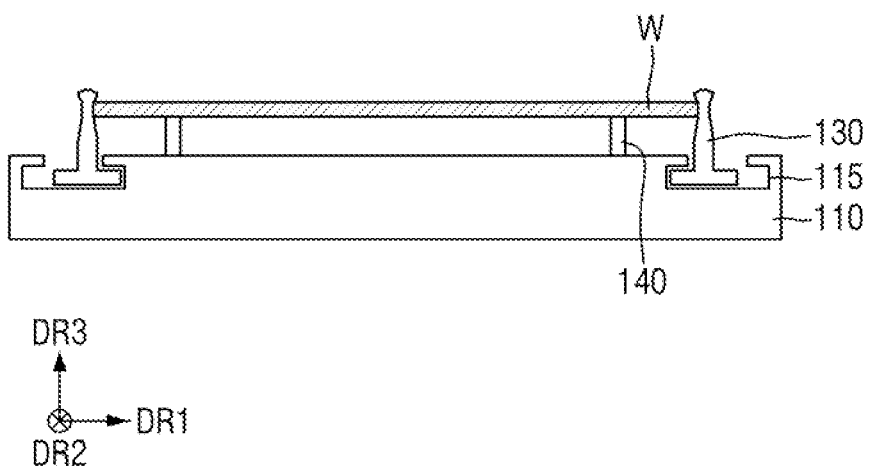

Referring to FIGS. 6 and 12, the wafer W may be dried (step S170). The second ultrapure water 30 remaining on the wafer W may be removed by drying the wafer W. The photoresist pattern may be formed on the wafer and the wafer may be cleaned by the wafer cleaning method shown in FIGS. 7 to 12.

The wafer cleaning apparatus and the wafer cleaning method, according to some embodiments of the present disclosure, may prevent deterioration of the wafer W due to stagnation of the liquid chemical 20 at a portion of the wafer W near the grip pin 130 for fixing the wafer W and preventing damage to the stage 110 due to inflow of the liquid chemical 20 to the stage 110 along the grip pin 130 by moving the grip pin 130 away from the wafer W in the wafer development process using the liquid chemical 20.

Hereinafter, a wafer cleaning apparatus according to embodiments of the present disclosure will be described with reference to FIGS. 13, 14 and 17. The following description is mainly directed to differences from the wafer cleaning apparatus shown in FIGS. 1 to 5. To the extent that an element is not described, this element may be assumed to be at least similar to corresponding elements that are described elsewhere in the specification.

Figure 13:
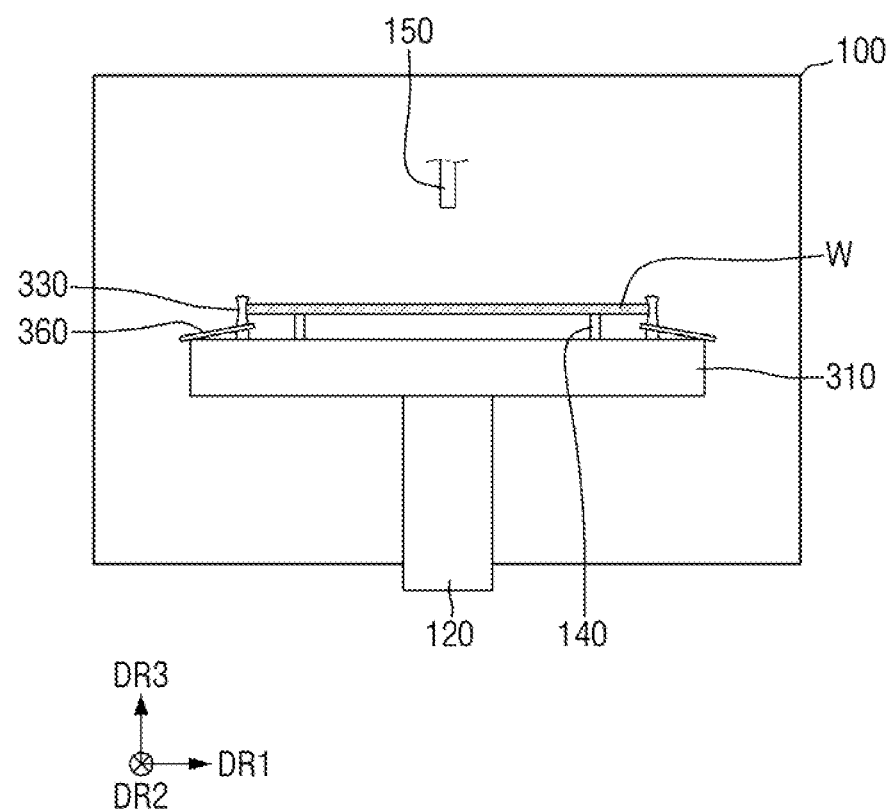
FIG. 13 is a cross-sectional diagram illustrating a wafer cleaning apparatus according to embodiments of the present disclosure.

FIG. 13 is a diagram illustrating a wafer cleaning apparatus according to embodiments of the present disclosure. FIG. 14 is a cross-sectional view illustrating a grip pin of a wafer cleaning apparatus according to some embodiments of the present disclosure. FIG. 17 is a plan view illustrating a stage of a wafer cleaning apparatus according to embodiments of the present disclosure.

Figure 17:
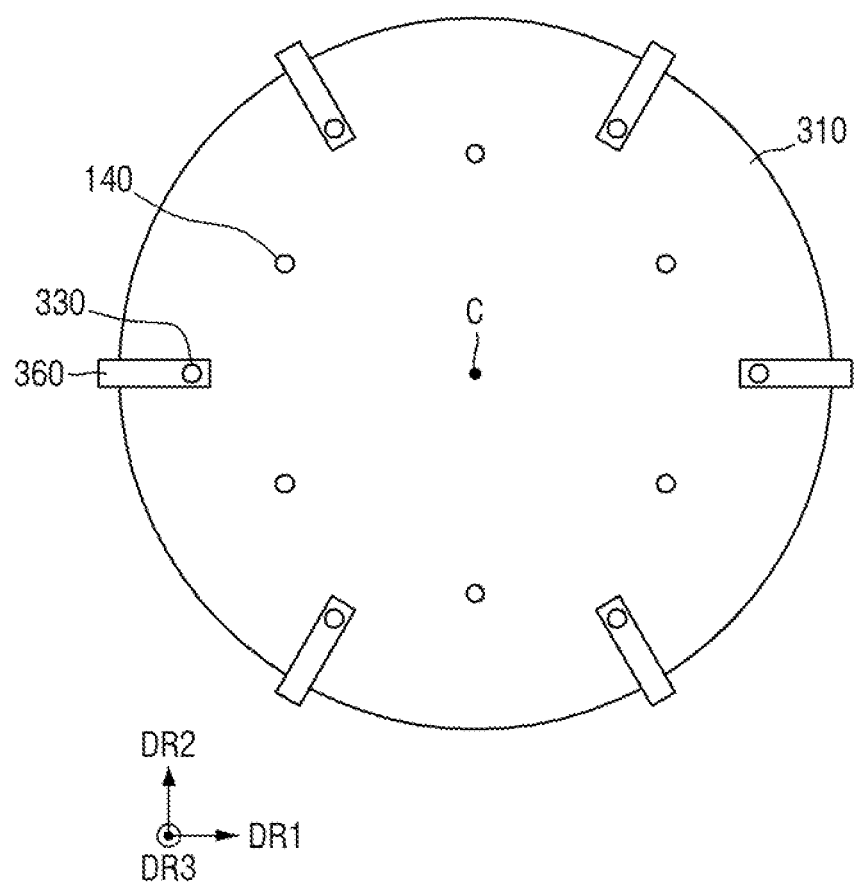
FIG. 17 is a plan view illustrating a stage of a wafer cleaning apparatus according to embodiments of the present disclosure.

Referring to FIGS. 13, 14 and 17, in a wafer cleaning apparatus according to some embodiments of the present disclosure, the connection groove 115 (see FIG. 1) is not formed at the stage 310. A grip pin 330 may be disposed on the top surface of the stage 310. The grip pin 330 may have a wafer contact portion 330a that is in contact with the side surface of the wafer W.

A first liquid chemical guide portion 360 may be inclined with respect to the top surface of the stage 310. The first liquid chemical guide portion 360 may be inclined such that the height from the top surface of the stage 310 becomes lower toward the side surface of the stage 310.

The first liquid chemical guide portion 360 may be connected to the grip pin 330. The first liquid chemical guide portion 360 may at least partially surround a part of the sidewall of the grip pin 330. The first liquid chemical guide portion 360 may be connected to a portion closer to the top surface of the stage 110 than the wafer contact portion 330a that is in contact with the side surface of the wafer W.

The first liquid chemical guide portion 360 may extend from the center C of the stage 310 toward the side surface of the stage 310. The end of the first liquid chemical guide portion 360 may project laterally from the side surface of the stage 310. The first liquid chemical guide portion 360 may be in contact with the top surface of the stage 310 at the edge of the stage 310. However, the present disclosure is not necessarily limited thereto. In some embodiments, the first liquid chemical guide portion 360 may be separated from the top surface of the stage 310 at the edge of the stage 310.

Referring to the first liquid chemical guide portion 360 illustrated in FIG. 14, the cross section of the first liquid chemical guide portion 360 in the second direction DR2 may have, e.g., a semicircular shape. However, the present disclosure is not necessarily limited thereto.

The wafer cleaning apparatus, according to some embodiments of the present disclosure, may guide the liquid chemical 20 flowing along the grip pin 330 for fixing the wafer W to the outside of the stage 310 by connecting the inclined first liquid chemical guide portion 360 to the grip pin 330 in the wafer development process using the liquid chemical 20. Accordingly, it is possible to prevent deterioration of the wafer W due to stagnation of the liquid chemical 20 at a portion of the wafer W near the grip pin 330 and prevent damage to the stage 310 due to inflow of the liquid chemical 20 to the stage 310 along the grip pin 330.

Hereinafter, a wafer cleaning apparatus according to embodiments of the present disclosure will be described with reference to FIG. 15. The following description is mainly directed to differences from the wafer cleaning apparatus shown in FIGS. 13, 14 and 17. To the extent that an element is not described, this element may be assumed to be at least similar to corresponding elements that are described elsewhere in the specification.

FIG. 15 is a cross-sectional view illustrating a grip pin of a wafer cleaning apparatus according to some embodiments of the present disclosure.

Referring to FIG. 15, the wafer cleaning apparatus, according to some embodiments of the present disclosure, may include a grip pin 430 having a second portion 432 and a third portion 433.

The grip pin 430 may have a wafer contact portion 432a that is in contact with the side surface of the wafer W. The first liquid chemical guide portion 360 illustrated in FIG. 15 may have the same structure as that of the first liquid chemical guide portion 360 illustrated in FIG. 14.

The second portion 432 of the grip pin 430 may be in contact with the top surface of the stage 310 (see FIG. 13). The second portion 432 of the grip pin 430 may project from the top surface of the stage 310 (see FIG. 13) in the third direction DR3.

The third portion 433 of the grip pin 430 may be disposed on the sidewall of the second portion 432 of the grip pin 430. The third portion 433 of the grip pin 430 may project from the second portion 432 of the grip pin 430 toward the center C of the stage 310 (see FIG. 13). The third portion 433 of the grip pin 430 may be in contact with the bottom surface of the wafer W.

In the wafer cleaning apparatus, according to some embodiments of the present disclosure, the wafer W may be effectively fixed by forming the third portion 433 of the grip pin 430 projecting from the second portion 432 of the grip pin 430 on the sidewall of the grip pin 430 that is in contact with the wafer W.

Hereinafter, a wafer cleaning apparatus according to embodiments of the present disclosure will be described with reference to FIG. 16. The following description is mainly directed to differences from the wafer cleaning apparatus shown in FIGS. 13, 14 and 17. To the extent that an element is not described, this element may be assumed to be at least similar to corresponding elements that are described elsewhere in the specification.

Figure 16:
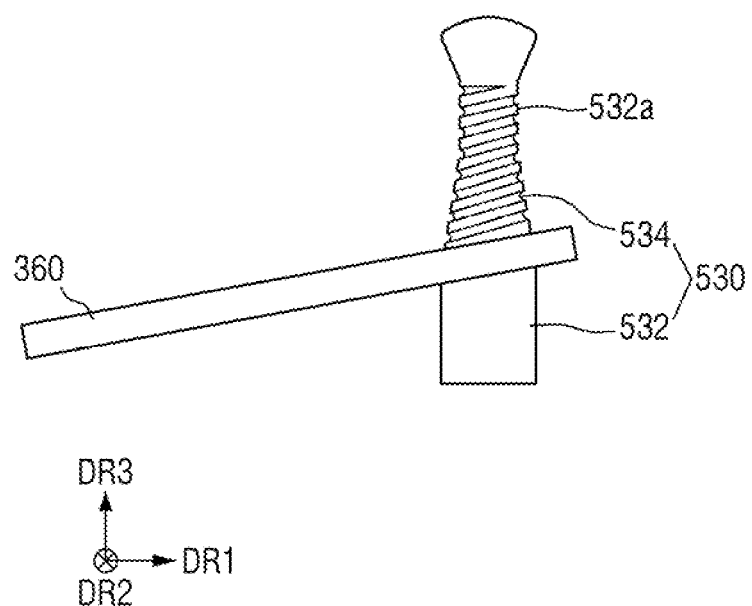
FIG. 16 is a cross-sectional view illustrating a grip pin of a wafer cleaning apparatus according to some embodiments of the present disclosure.

FIG. 16 is a cross-sectional view illustrating a grip pin of a wafer cleaning apparatus according to some embodiments of the present disclosure.

Referring to FIG. 16, the wafer cleaning apparatus, according to some embodiments of the present disclosure, may include a grip pin 530 having a second portion 532 and a spiral groove 534.

The grip pin 530 may have a wafer contact portion 532a that is in contact with the side surface of the wafer W. The first liquid chemical guide portion 360 illustrated in FIG. 16 may have the same structure as that of the first liquid chemical guide portion 360 illustrated in FIG. 14.

The second portion 532 of the grip pin 530 may be in contact with the top surface of the stage 310 (see FIG. 13). The second portion 532 of the grip pin 530 may project from the top surface of the stage 310 (see FIG. 13) in the third direction DR3.

The spiral groove 534 of the grip pin 530 may be spirally formed along the outer peripheral surface of the sidewall of the second portion 532 of the grip pin 530. The spiral groove 534 of the grip pin 530 may be formed higher than the first liquid chemical guide portion 360.

The spiral groove 534 of the grip pin 530 may be spirally formed along the outer peripheral surface of the sidewall of the wafer contact portion 532a. However, the present disclosure is not necessarily limited thereto. In some embodiments, the spiral groove 534 of the grip pin 530 might not be formed on the outer peripheral surface of the sidewall of the wafer contact portion 532a. For example, the spiral groove 534 of the grip pin 530 may be formed between the first liquid chemical guide portion 360 and the wafer contact portion 532a.

The wafer cleaning apparatus, according to some embodiments of the present disclosure, may guide the liquid chemical 20 flowing along the grip pin 530 for fixing the wafer W to the outside of the stage 310 (see FIG. 13) by connecting the inclined first liquid chemical guide portion 360 to the grip pin 530 and forming the spiral groove 534 on the outer wall of the grip pin 530 in the wafer development process using the liquid chemical 20. Accordingly, it is possible to prevent deterioration of the wafer W due to stagnation of the liquid chemical 20 at a portion of the wafer W near the grip pin 530 and prevent damage to the stage 310 (see FIG. 13) due to inflow of the liquid chemical 20 to the stage 310 along the grip pin 530.

Hereinafter, a wafer cleaning apparatus according to embodiments of the present disclosure will be described with reference to FIGS. 18 to 20. The following description is mainly directed to differences from the wafer cleaning apparatus shown in FIGS. 13, 14 and 17.

Figure 18:
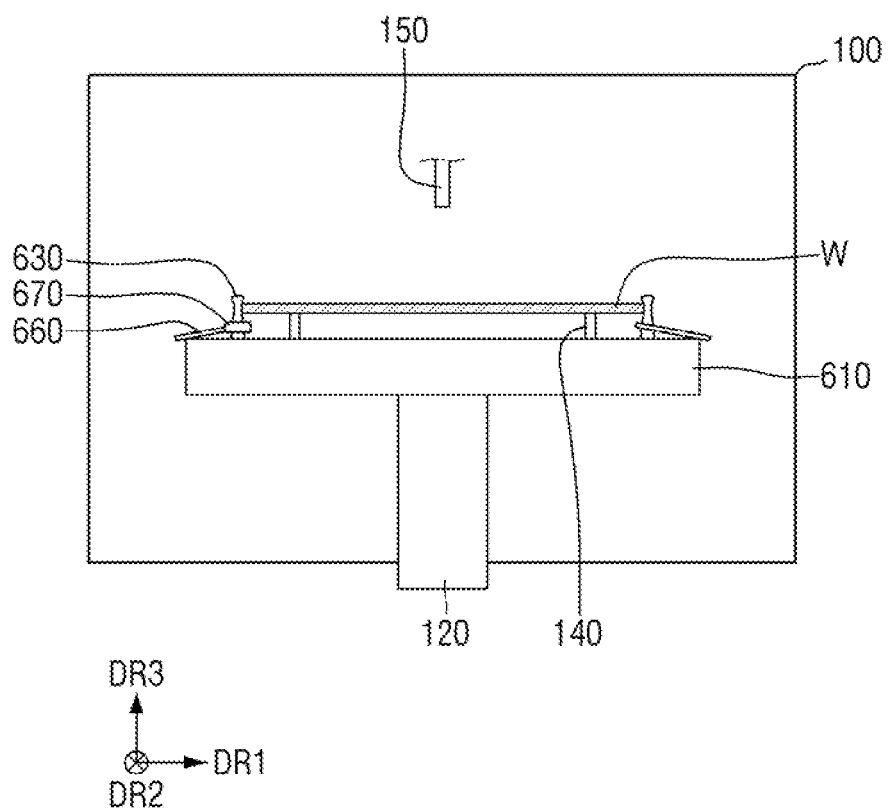
FIG. 18 is a cross-sectional view illustrating a wafer cleaning apparatus according to embodiments of the present disclosure.

FIG. 18 is a diagram illustrating a wafer cleaning apparatus according to embodiments of the present disclosure. FIG. 19 is a cross-sectional view illustrating a grip pin of a wafer cleaning apparatus according to some embodiments of the present disclosure. FIG. 20 is a plan view illustrating a stage of a wafer cleaning apparatus according to embodiments of the present disclosure.

Figure 19:
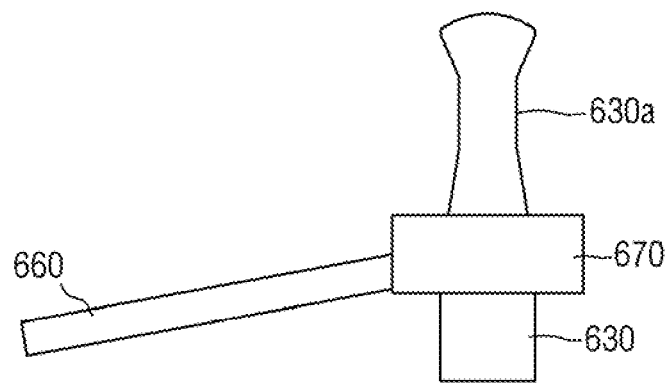
FIG. 19 is a cross-sectional view illustrating a grip pin of a wafer cleaning apparatus according to embodiments of the present disclosure.
Figure 20:
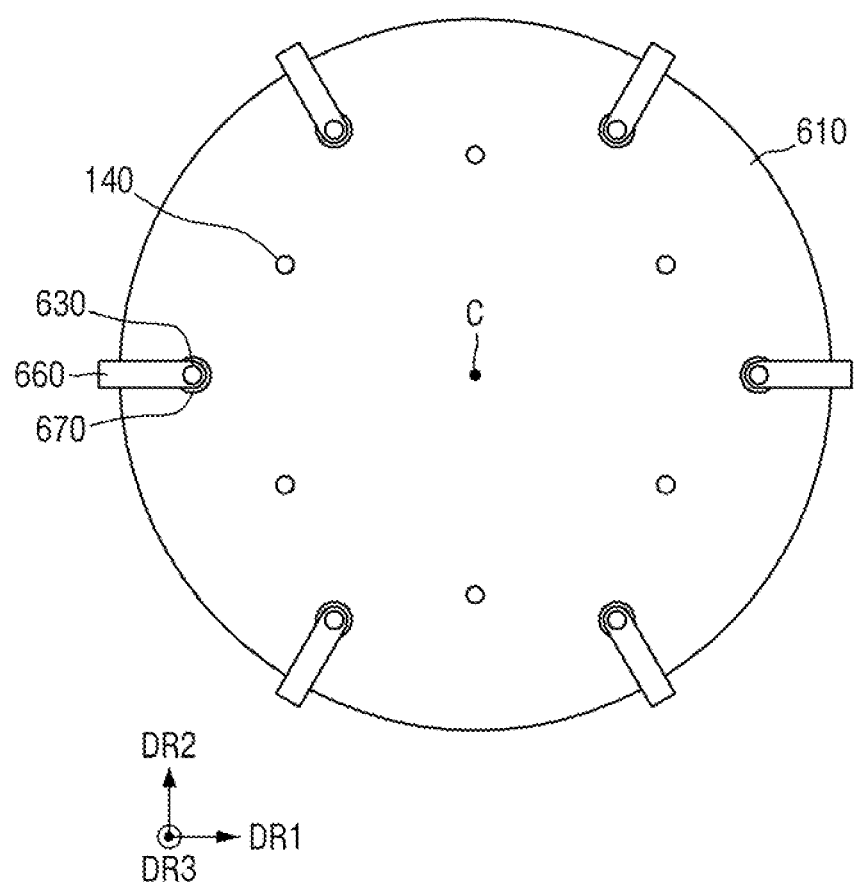
FIG. 20 is a plan view illustrating a stage of a wafer cleaning apparatus according to embodiments of the present disclosure.

Referring to FIGS. 18 to 20, a first liquid chemical guide portion 660 and a second liquid chemical guide portion 670 may be connected to a grip pin 630 of the wafer cleaning apparatus according to some embodiments of the present disclosure.

The grip pin 630 may have a wafer contact portion 632a that is in contact with the side surface of the wafer W. The grip pin 630 may be in contact with the top surface of the stage 610. The grip pin 630 may project from the top surface of the stage 610 in the third direction DR3.

The first liquid chemical guide portion 660 may be inclined with respect to the top surface of the stage 610. The first liquid chemical guide portion 660 may be inclined such that the height from the top surface of the stage 610 becomes lower toward the side surface of the stage 610.

The first liquid chemical guide portion 660 may be connected to one sidewall of the grip pin 630. The first liquid chemical guide portion 660 may be connected to a portion closer to the top surface of the stage 610 than the wafer contact portion 630a that is in contact with the side surface of the wafer W.

The first liquid chemical guide portion 660 may extend from the center C of the stage 610 toward the side surface of the stage 610. The end of the first liquid chemical guide portion 660 may project laterally from the side surface of the stage 610. The first liquid chemical guide portion 660 may be in contact with the top surface of the stage 610 at the edge of the stage 610. However, the present disclosure is not necessarily limited thereto. In some embodiments, the first liquid chemical guide portion 660 may be separated from the top surface of the stage 610 at the edge of the stage 610.

Referring to the first liquid chemical guide portion 660 illustrated in FIG. 19, the cross section of the first liquid chemical guide portion 660 in the second direction DR2 may have, e.g., a semicircular shape. However, the present disclosure is not necessarily limited thereto.

The second liquid chemical guide portion 670 may at least partially surround the sidewall of the grip pin 630. The second liquid chemical guide portion 670 may be in contact with a part of the first liquid chemical guide portion 660 that is adjacent to the grip pin 630. The second liquid chemical guide portion 670 may have a cylindrical shape with an outer wall and a bottom surface. However, the present disclosure is not necessarily limited thereto.

The second liquid chemical guide portion 670 may at least partially surround the sidewall of the grip pin 630 closer to the top surface of the stage 610 than the wafer contact portion 630a.

The wafer cleaning apparatus, according to some embodiments of the present disclosure, may guide the liquid chemical 20 flowing along the grip pin 630 for fixing the wafer W to the outside of the stage 610 by connecting the inclined first liquid chemical guide portion 660 and the second liquid chemical guide portion 670 that can store a part of the liquid chemical 20 to the grip pin 630 in the wafer development process using the liquid chemical 20. Accordingly, it is possible to prevent deterioration of the wafer W due to stagnation of the liquid chemical 20 at a portion of the wafer W near the grip pin 630 and prevent damage to the stage 610 due to inflow of the liquid chemical 20 to the stage 610 along the grip pin 630.

In concluding the detailed description, those skilled in the art will appreciate that many variations and modifications can be made to the preferred embodiments without substantially departing from the principles of the present disclosure.

What is claimed is:

1. A method for cleaning a wafer, comprising:
providing a wafer on a stage inside of a chamber;
fixing the wafer to the stage by moving a grip pin that is connected to an edge of the stage to the wafer;
supplying first ultrapure water onto the wafer while the wafer is rotating at a first rotation speed;
releasing the grip pin from the wafer by moving the grip pin away from the wafer; and
performing a development process by supplying liquid chemical onto the wafer while the wafer is rotating at a second rotation speed that is less than the first rotation speed.

2. The wafer cleaning method of claim 1, further comprising, after the development process is completed:
moving the grip pin toward a center of the stage to fix the wafer to the stage;
supplying second ultrapure water onto the wafer while the wafer is rotating at the first rotation speed to clean the wafer; and
drying the wafer.

3. The wafer cleaning method of claim 1, wherein the providing of the wafer onto the stage comprises:

forming a photoresist layer on the wafer;
forming a mask pattern on the photoresist layer; and
exposing the photoresist layer through the mask pattern.

4. The wafer cleaning method of claim 1, wherein the fixing of the wafer to the stage by moving the grip pin comprises:
moving the grip pin toward a center of the stage to bring the grip pin into contact with a side surface of the wafer.

5. The wafer cleaning method of claim 1, wherein the releasing of the grip pin from the wafer by moving the grip pin comprises:
moving the grip pin toward the edge of the stage to separate the grip pin from a side surface of the wafer.

6. The wafer cleaning method of claim 1, wherein the supplying of the first ultrapure water onto the wafer comprises:
supplying the first ultrapure water to each of a top surface of the wafer and a bottom surface of the wafer.

7. The wafer cleaning method of claim 1, wherein the performing of the development process by supplying the liquid chemical onto the wafer comprises:
supplying the liquid chemical to each of a top surface of the wafer and a bottom surface of the wafer;
removing the liquid chemical supplied to the bottom surface of the wafer; and
performing the development process on the top surface of the wafer using the liquid chemical.

8. The wafer cleaning method of claim 1, wherein the first rotation speed is 100 rpm or more, and the second rotation speed is less than 100 rpm.

9. The wafer cleaning method of claim 1, wherein the grip pin moves along a connection groove formed at the edge of the stage.

10. The wafer cleaning method of claim 9, wherein the grip pin includes a first portion disposed inside of the connection groove, and a second portion projecting from a top surface of the stage, the second portion being in contact with a side surface of the wafer.

11. The wafer cleaning method of claim 1, further comprising:
a support pin disposed between the edge of the stage where the grip pin is disposed and a center of the stage on a top surface of the stage, the support pin being in contact with a bottom surface of the wafer.

12. The wafer cleaning method of claim 11, wherein the performing of the development process by supplying the liquid chemical onto the wafer comprises:
rotating the wafer at the second rotation speed while the wafer is separated from the grip pin and is in contact with the support pin.

13. A wafer cleaning apparatus, comprising:
a chamber;
a stage disposed inside the chamber and including a connection groove formed at an edge of the stage;
a nozzle configured to supply liquid chemical to a wafer disposed on the stage; and
a grip pin, a base of which is recessed within the connection groove, and the grip pin is configured to move linearly toward a center of the stage by moving the base thereof, as a whole, within the connection groove of the stage upon which the wafer is disposed, to fix the wafer to the stage.

14. The wafer cleaning apparatus of claim 13, wherein the base of the grip pin is a first portion disposed inside of the connection groove, and a second portion of the grip pin projects from a top surface of the stage, the second portion being in contact with a side surface of the wafer, the second portion of the grip pin being fixedly connected to the first portion so that the two portions do not move with respect to one another.

15. The wafer cleaning apparatus of claim 14, wherein the grip pin further includes a third portion projecting from the second portion toward the center of the stage, the third portion being in contact with a bottom surface of the wafer.

16. The wafer cleaning apparatus of claim 13, further comprising a support pin disposed between the edge of the stage where the grip pin is disposed and a center of the stage on a top surface of the stage, the support pin being in contact with a bottom surface of the wafer.

17. A wafer cleaning apparatus, comprising:
a chamber;
a stage disposed inside of the chamber;
a nozzle configured to supply liquid chemical to a wafer provided on the stage;
a grip pin disposed on a top surface of an edge of the stage, the grip pin fixing the wafer to the stage; and
a first liquid chemical guide portion connected to the grip pin, the first liquid chemical guide portion being inclined with respect to a top surface of the stage, the first liquid chemical guide portion projecting laterally from the edge of the stage such that an output port of the first liquid chemical guide portion is disposed between the wafer and the stage,
wherein the grip pin penetrates the first liquid chemical guide portion in a direction perpendicular to the top surface of the stage.

18. The wafer cleaning apparatus of claim 17, wherein the first liquid chemical guide portion at least partially surrounds a sidewall of the grip pin.

19. The wafer cleaning apparatus of claim 17, wherein the grip pin further includes a spiral groove formed on a sidewall of the grip pin.

20. The wafer cleaning apparatus of claim 17, further comprising a second liquid chemical guide portion connected to the first liquid chemical guide portion, the second liquid chemical guide portion having a cylindrical shape at least partially surrounding a sidewall of the grip pin.

* * * * *